United States Patent
Imamiya et al.

[11] Patent Number: 5,917,756
[45] Date of Patent: Jun. 29, 1999

[54] NONVOLATILE SEMICONDUCTOR MEMORY CELL CAPABLE OF SAVING OVERWRITTEN CELL AND ITS SAVING METHOD

[75] Inventors: Keniti Imamiya; Hiroshi Nakamura, both of Kawasaki, Japan

[73] Assignee: Kabushiki Kaisha Toshiba, Tokyo, Japan

[*] Notice: This patent is subject to a terminal disclaimer.

[21] Appl. No.: 08/906,209

[22] Filed: Aug. 5, 1997

Related U.S. Application Data

[63] Continuation of application No. 08/534,339, Sep. 27, 1995, Pat. No. 5,691,941.

[30] Foreign Application Priority Data

Sep. 30, 1994 [JP] Japan ...................................... 6-238078
Sep. 20, 1995 [JP] Japan ...................................... 7-241394

[51] Int. Cl.$^6$ .................................................. G11C 11/34
[52] U.S. Cl. ............................... 365/185.3; 365/185.17; 365/185.22; 365/185.24
[58] Field of Search ........................... 365/185.3, 185.17, 365/185.08, 185.22, 185.24

[56] References Cited

U.S. PATENT DOCUMENTS

| | | |
|---|---|---|
| 5,122,985 | 6/1992 | Santin . |
| 5,293,350 | 3/1994 | Kim et al. . |
| 5,299,162 | 3/1994 | Kim et al. . |
| 5,357,462 | 10/1994 | Tanaka et al. . |
| 5,361,227 | 11/1994 | Tanaka et al. . |
| 5,465,235 | 11/1995 | Miyamoto . |
| 5,691,941 | 11/1997 | Imamiya et al. ...................... 365/185.3 |

FOREIGN PATENT DOCUMENTS 42 32 025 A1  4/1993  Germany .

OTHER PUBLICATIONS

1995 IEEE ISSCC Digest of Technical Papers, vol. 38, pp. 130–131.

Shin–Ichi Kobayashi et al: "Memory Array Architecture and Decoding Cheme for 3V Only Sevtor Erasable Dinor Flash Memory," Proceedings of the Symposium on VLSI Circuits, Kyoto, May 19–21, 1993, May 19, 1993, Institute of Electrical and Electronics Engineers, pp. 97–98.

*Primary Examiner*—David C. Nelms
*Assistant Examiner*—Hien Nguyen
*Attorney, Agent, or Firm*—Banner & Witcoff, Ltd.

[57] ABSTRACT

If data is read from a selected memory cell at the time of overwrite verifying, a potential of a bit line is changed in accordance with data. If a transistor is turned on, a latch circuit is set in accordance with data of the bit line. In a case where there is a memory cell being in an overwrite state, data of the selected memory cell is latched to the latch circuit, and data corresponding to one page is erased. Thereafter, a normally writing operation is executed by data latch to the latch circuit, thereby the memory cell being in the overwrite state can be used as a normal threshold voltage.

20 Claims, 10 Drawing Sheets

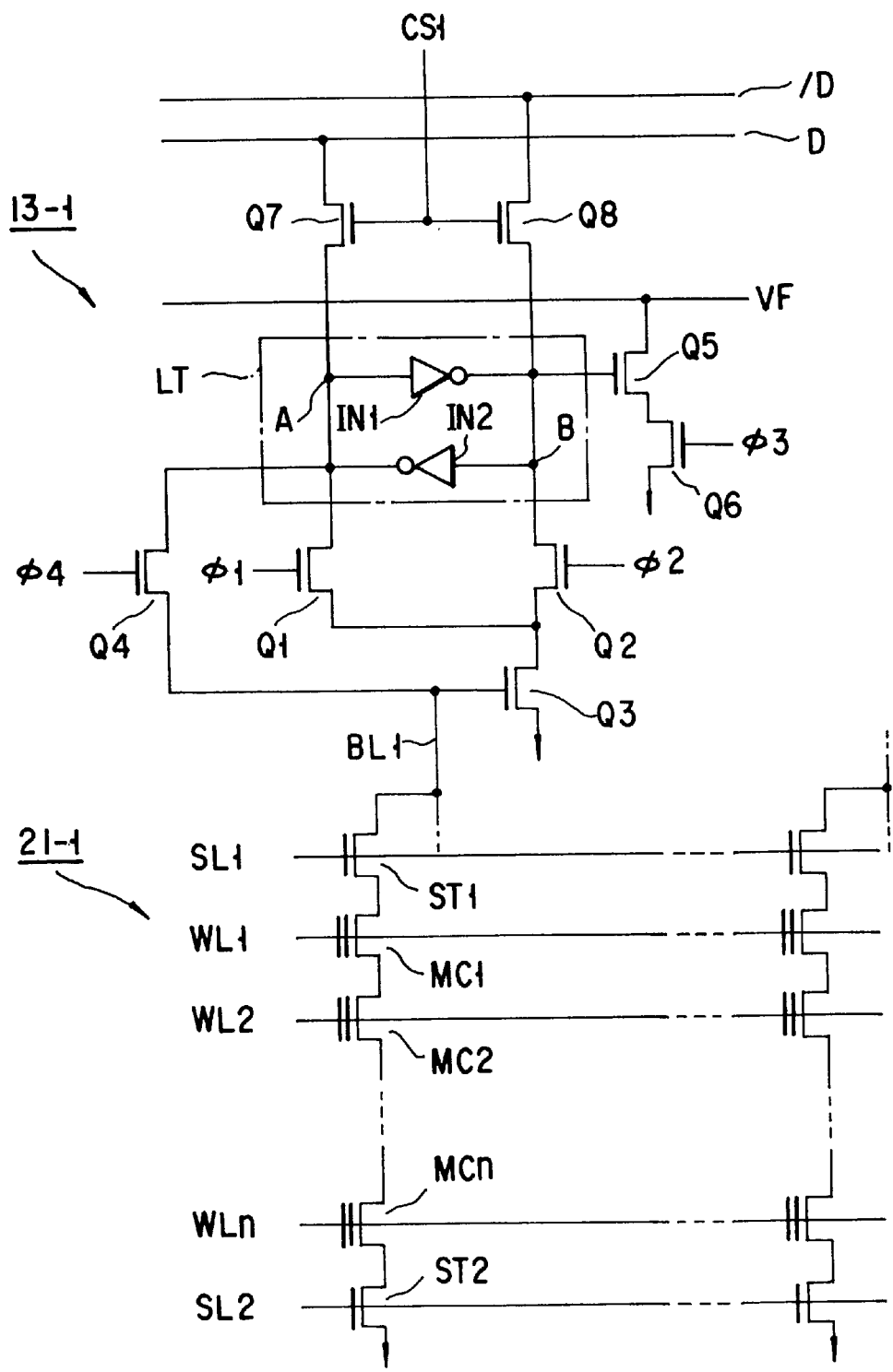
F I G. 1

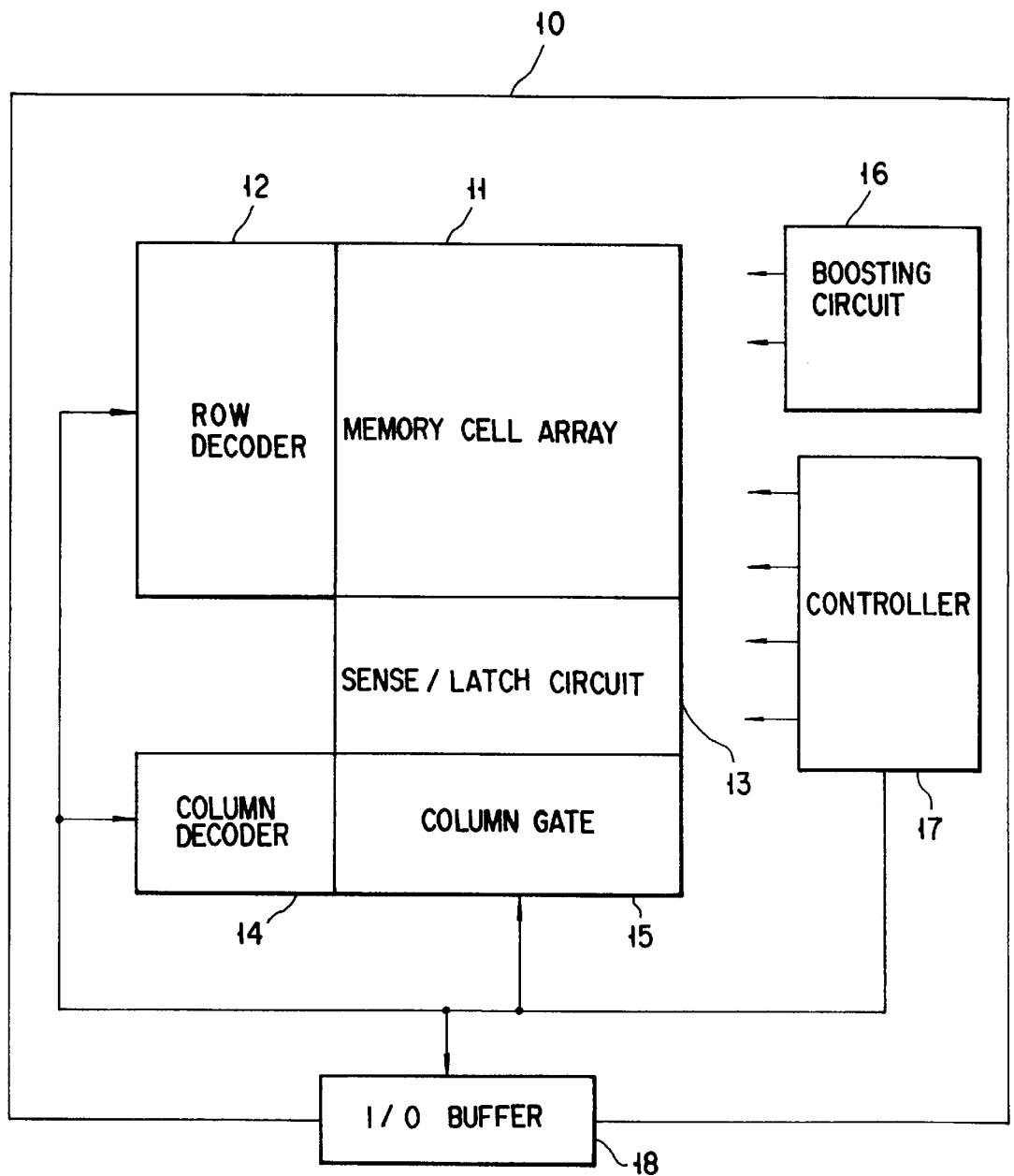
F I G. 2

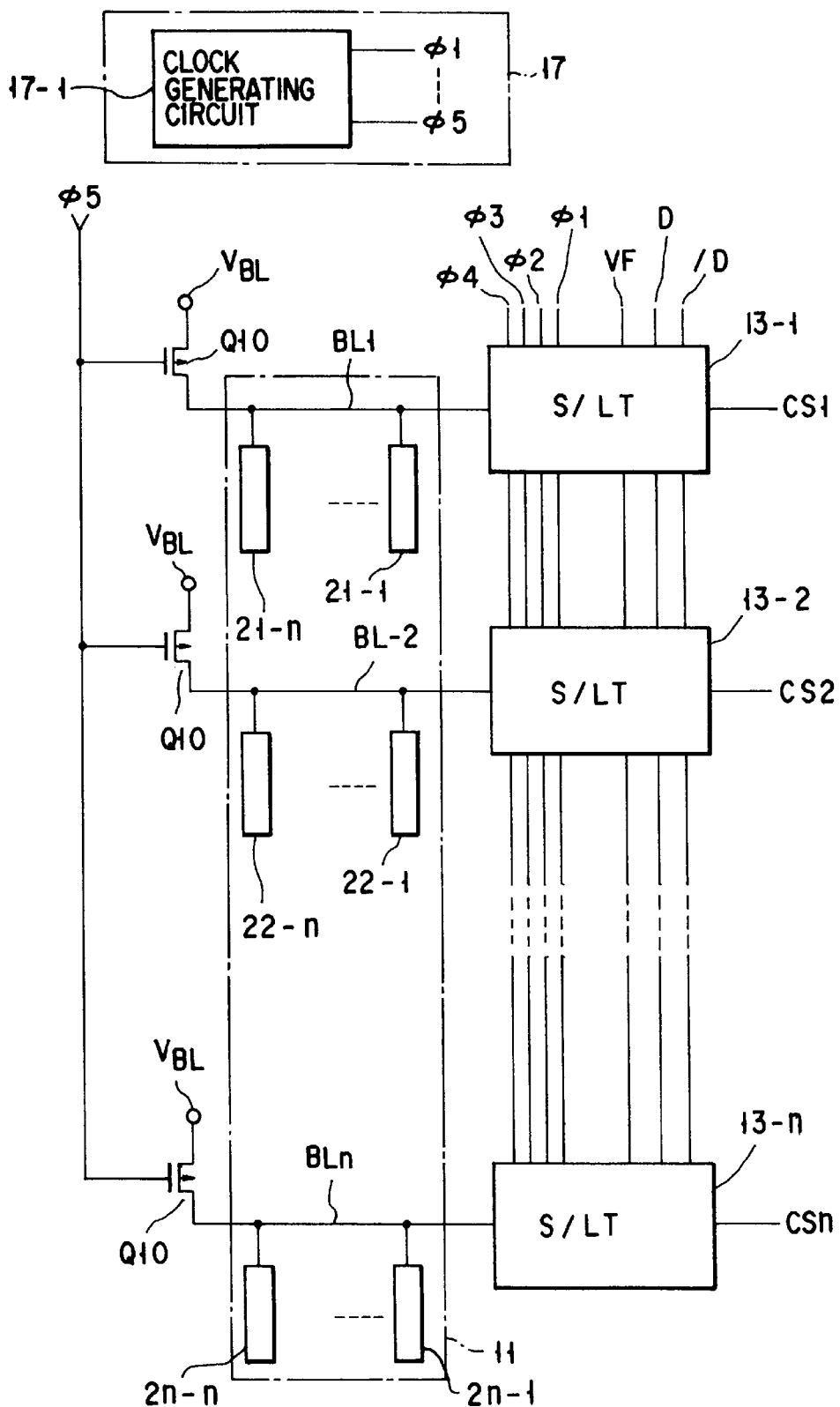
F I G. 3

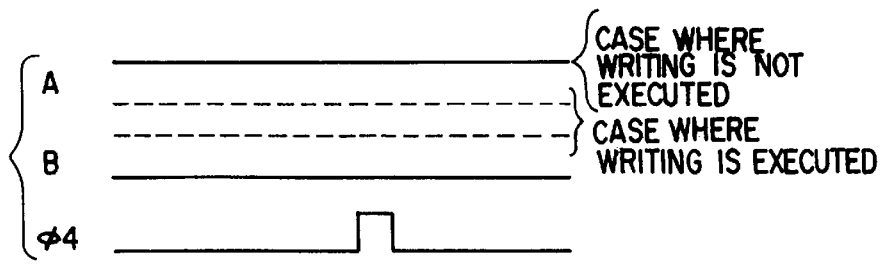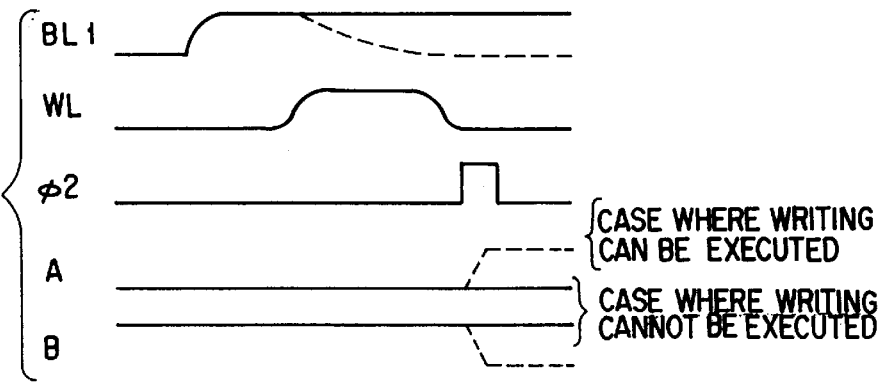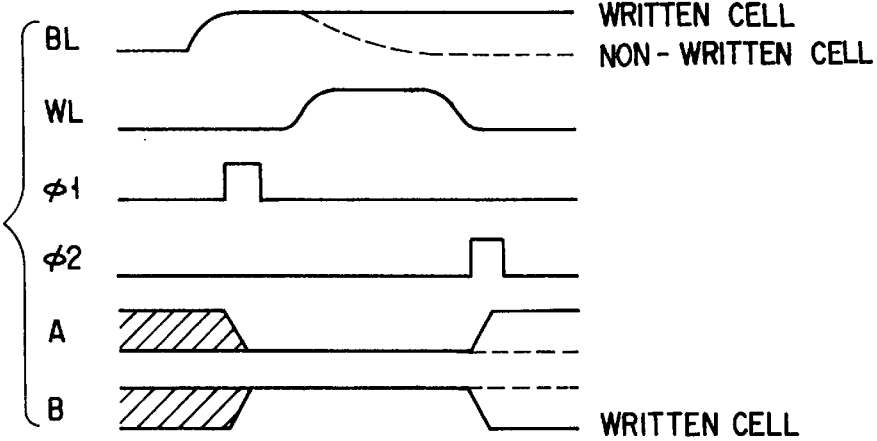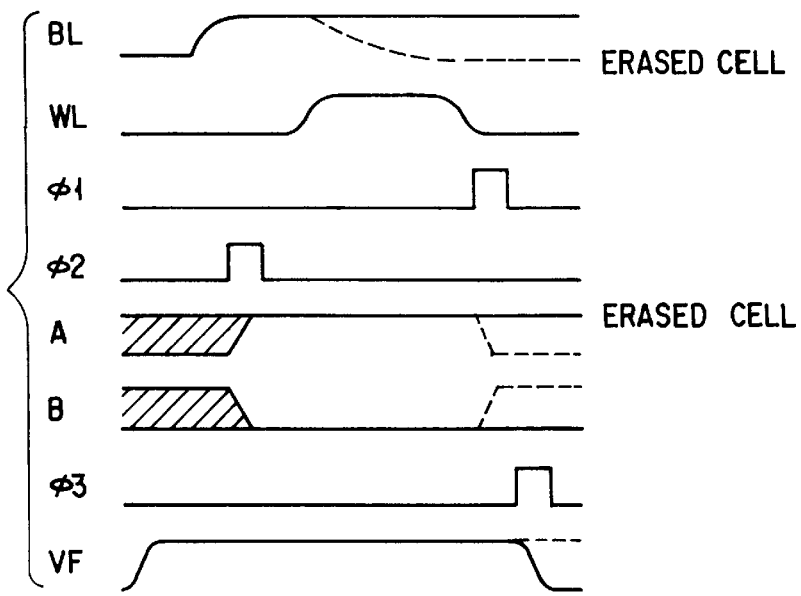

|  | READ | ERASE | WRITE |
|---|---|---|---|
| BL | 5V PRECHARGE | OPEN | "0" WRITE 0V<br>"1" WRITE 9V |
| SL1 | 5V | 0V | 11V |
| WL | SELECTED 0V<br>NON-SELECTED 5V | 0V | SELECTED 18V<br>NON-SELECTED 9V |
| SL2 | 5V | 0V | 0V |
| W | 0V | 18V | 0V |
| S | 0V | 18V | 0V |

FIG. 22

NONVOLATILE SEMICONDUCTOR MEMORY CELL CAPABLE OF SAVING OVERWRITTEN CELL AND ITS SAVING METHOD

This application is a continuation of application Ser. No. 08/534339 filed Sep. 27, 1995, now U.S. Pat. No. 5,691,941.

BACKGROUND OF THE INVENTION

1. Field of the Invention

The present invention relates to a flash EEPROM and particularly to a nonvolatile semiconductor memory device, which is capable of saving its overwrite state.

2. Description of the Related Art

FIG. 20 is a circuit diagram showing a cell structure of a NAND-structured flash memory. In the NAND-structured flash memory, memory cells M1 to M16, each comprising a MOS transistor having a floating gate and a control gate, are connected in series. One end of a group of memory cells are connected to a bit line BL through a select transistor Q11, and the other end is connected to a common source line S through a select transistor Q12. Each transistor is formed on the same well W. The control gate of each of memory cells M1 to M16 is connected to each of word lines WL1 to WL16. The gate of the select transistor Q11 is connected to a select line SL1. The control gate of the select transistor Q12 is connected to a select line SL2.

In the NAND-structured flash memory, a state in which data "1" is normally stored is called "erase state", and a state in which data "0" is stored is called "write state." The memory cell storing data "0" has a threshold voltage of 0 V or more to 5 V or less, and the memory cell storing data "1" has a threshold voltage of 0 V or less. As shown in FIG. 21A, a state in which the threshold voltage of the memory cell storing data "1" is shifted in a positive direction to store data "0" is called "writing operation." As shown in FIG. 21B, a state in which the threshold voltage of the memory cell storing data "0" is shifted in a negative direction to store data "1" is called "erasing operation."

FIG. 22 shows a voltage to be applied to the memory cell at the time of each of the reading operation, the erasing operation, and the writing operation.

For example, at the time of the reading operation, the bit line BL is precharged to 5 V, and set to be in a floating state. Thereafter, 5 V is applied to the select line SL1, 0 V is applied to the word line WL of the selected memory cell, 5 V is applied to the word line WL of a non-selected memory cell, 5 V is applied to the select line SL2, 0 V is applied to the well W, and 0 V is applied to a common source line S. As a result, all transistors except the selected memory cell are turned on. In a case where data "0" is stored in the selected memory cell, the memory cell becomes non-conductive, and the potential of the bit line BL, which is 5 V, is unchanged. In a case where data "1" is stored in the selected memory cell, the memory cell becomes conductive, and the bit line BL is discharged and the potential is decreased. The potential of the bit line is detected, and thereby data is sensed.

At the time of the erasing operation, the bit line BL is opened, 0 V is applied to the select line SL1, 0 V is applied to the word line WL of the memory cell, 0 V is applied to the select line SL2, 18 V is applied to the well W, and 18 V is applied to the common source line S. As a result, a tunnel current is supplied between the floating gate and the well through a gate insulation film, and the threshold voltage becomes 0 V or less.

At the time of the writing operation, a different voltage is applied depending on writing data. More specifically, in a case where data "0" is written, 0 V is applied to the bit line BL. In a case where data "1" is written, 9 V is applied to the bit line BL. Then, 11 V is applied to the select line SL1, 18 V is applied to the word line WL of the selected memory cell, 9 V is applied to the word line WL of the non-selected memory cell, 0 V is applied to the select line SL2, 0 V is applied to the well W, and 0 V is applied to the common source line S. As a result, all transistors, including the select transistor Q11 to the memory cell M16, become conductive to have the same potential as the bit line.

Therefore, in the memory cell in which 0 V is applied to the bit line BL, the voltage between the channel and the control gate becomes high, e.g., 18 V, and the threshold voltage of the memory cell is shifted in the positive direction by the tunnel current. In the memory cell in which 9 V is applied to the bit line BL, since only 9 V is applied between the channel and the control gate, the shift of the threshold voltage to the positive direction is restrained. Such a voltage of 9 V is called a write prohibition voltage.

In the nonvolatile semiconductor memory device, since data is written by use of the tunnel current, a writing speed is varied, depending on each memory cell. Due to this, even if the writing time is the same in each memory cell, the threshold voltage of a certain memory cell ranges from 0 V to 5 V, and there is a case in which the threshold voltage of the other memory cell exceeds 5 V.

As mentioned above, in the NAND-structured flash memory, 5 V is applied to the word line of the non-selected memory at the time of the reading operation, so that the memory cell is turned on. However, if the threshold voltage of a certain memory cell exceeds 5 V, the memory cell is maintained in an off state. As a result, a current path is interrupted by the certain memory cell, data of all other memory cells, which are connected to the certain memory cell in series, cannot be read.

In order to avoid generating such a problem, there is used a method in which the writing time is divided into a short time period to repeat a cycle of writing→verifying→data setting for rewriting→writing→verifying→data setting for rewriting . . . The memory in the threshold voltage is sufficiently increased by the verifying operation and sets rewriting data not to perform the writing operation in a next cycle.

In other words, in a case where the threshold voltage of the selected memory cell MC to be written is −1 V at the end of the first writing operation as shown in FIG. 23A, the rewriting operation is performed and the threshold voltage ranges from 0 V to 5 V as shown in FIG. 23B. As a result, the writing operation of the cell whose writing speed is high is rapidly ended, and the threshold voltage is not increased thereafter.

However, as shown in FIG. 23C, there is a case in which the threshold voltage of the selected memory cell MC is sharply increased at the time of the first writing operation and exceeds the upper limit of 5 V. In this case, the writing operation is normally ended at the time of the verifying operation. However, data of all other memory cells, which are connected to the memory cell in series, cannot be read as mentioned above. Such a phenomenon occurs in a case where the writing and erasing are repeatedly performed, and it is difficult to screen the memory cell by a test.

SUMMARY OF THE INVENTION

An object of the present invention is to provide a nonvolatile semiconductor memory device wherein even when a memory cell, which is an overwritten state that a threshold voltage is increased to be higher than a predetermined voltage by one writing operation, the memory cell can be saved, and a method for saving its overwrite state of the memory cell.

The above object can be achieved by the following structure.

A nonvolatile semiconductor memory device comprising a memory cell array including a plurality of memory cells: a bit line to which the memory cell array is connected; a latch circuit for latching data to be written to the memory cell and data read from the memory cell; and controllers connected between the latch circuit and the bit line, wherein when a memory cell in an overwrite state is present in the plurality of memory cells, the controllers read data of the memory cell to be copied to the latch circuit, data of the memory cell is erased, and thereafter data copied to the latch circuit is written to the memory cell.

A method for saving overwrite of a nonvolatile semiconductor memory device comprising the steps of reading data of a memory cell to be copied to a latch circuit when data is overwritten to the memory cell; erasing data of the memory cell; and writing data copied to the latch circuit to the memory cell.

In other words, in a case where a memory state of an overwrite state is detected at the time of overwrite verifying, data stored in the memory cell is read, and the read data is copied to the latch circuit. An amount of data written to the writing cell is sufficient and data is not sufficiently written to the non-writing cell. Due to this, writing data is latched to the latch circuit similar to the state when data starts to be written to the memory cell. Thereafter, data of the memory cell of the overwrite state is erased, and data latched to the latch circuit is written again to the memory cell where data is erased. Thereby, the threshold voltage of the memory cell, which is in the overwrite state, can be set to a normal value.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 shows an embodiment of a sense/latch circuit of the present invention, and is a circuit diagram showing a part of FIG. 3;

FIG. 2 is a structural view schematically showing the embodiment of FIG. 1;

FIG. 3 is a structural view showing the extracted main part of FIG. 2;

FIG. 4 is a timing view showing a writing operation of FIG. 1;

FIG. 5 is a timing view showing a write verifying operation of FIG. 1;

FIG. 6 is a timing view showing a reading operation of FIG. 1;

FIG. 7 is a timing view showing an erase verifying operation of FIG. 1;

FIG. 22 is a view explaining various kinds of operations of the circuit of FIG. 20.

DETAILED DESCRIPTION OF THE PREFERRED EMBODIMENTS

Figure 8:
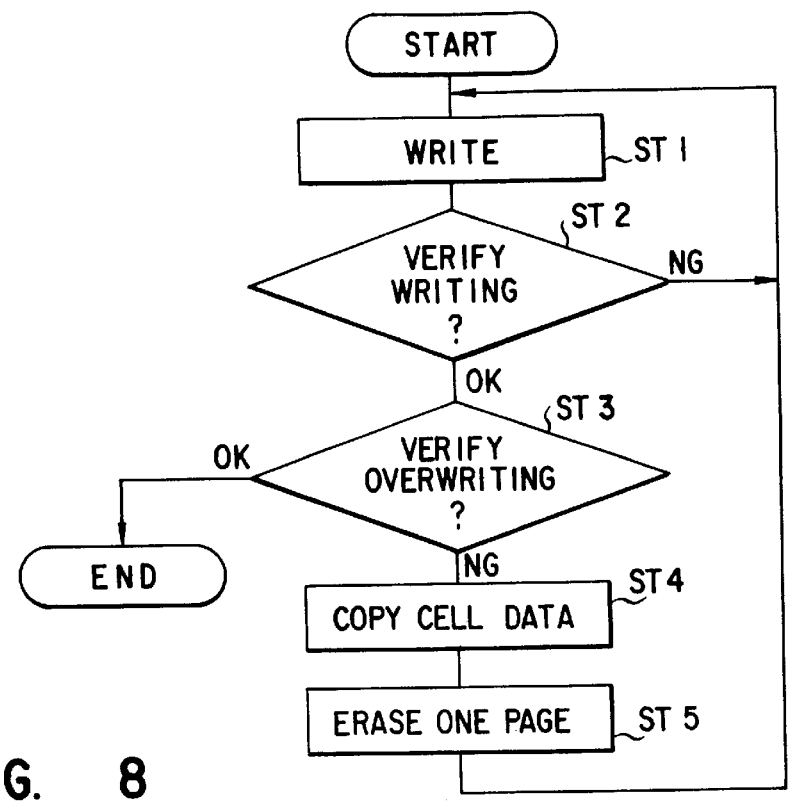
FIG. 8 shows an operation of FIG. 1, and is a flow chart showing an embodiment of saving the overwritten cell.

Embodiments of the present invention will be explained with reference to the drawings.

FIG. 2 shows a general structure of a nonvolatile semiconductor memory device using a NAND-structured flash memory. A nonvolatile semiconductor memory device 10 comprises a memory cell array 11, a row decoder 12, a sense/latch circuit 13, a column decoder 14, a column gate 15, a boosting circuit 16, a controlling circuit 17, and an I/O buffer 18.

In the memory cell array 11, a plurality of NAND-structured memory cells are formed in a matrix, and thousands of bit lines are arranged in a vertical direction, and thousands of word lines are arranged in a horizontal direction. The row decoder 12 selects the word line based on an address inputted from an outer unit. The sense/latch circuit 13 including the sense circuit and data latch circuit is connected to the bit line (to be described later) of the memory cell array 11 and the column gate 15. The column gate 15 is connected to the column decoder 14 and the I/O buffer 18. The column decoder 14 controls the column gate 15 based on an address inputted from the outer unit through the I/O buffer 18 to select the bit line and the corresponding sense/latch circuit 13. The boosting circuit 16 supplies a high voltage necessary for a writing operation and an erasing operation. The controlling circuit 17 controls a writing operation, an erasing operation, a reading operation, a write verifying operation, an overwrite verifying operation to be described later, a copy operation of cell data for copying data stored in the memory cell to the latch circuit, and a one page erasing operation for erasing data corresponding to one page. Also, the I/O buffer 18 is interfaced with an outer section of a chip.

FIG. 3 is a circuit diagram showing the main part of FIG. 2, and the same reference numerals are added to the portion common to FIG. 2. In FIG. 3, NAND-structured flash memories 21-1 to 21-n are connected to the bit line BL1. NAND-structured flash memories 22-1 to 22-n are connected to the bit line BL2. NAND-structured flash memories 2n-1 to 2n-n are connected to the bit line BLn. Each of sense/latch circuits (S/LT) 13-1, 13-2 to 13-n is connected to one end of each of the bit lines BL1, BL2 to BLn. The sense/latch circuits 13-1, 13-2 to 13-n are selected by column select signals CS1, CS2 to CSn outputted from the column gate, respectively. Data lines D, /D (symbol "/" shows an inversion signal) for transmitting data, and a verify line VF are connected to the sense/latch circuits 13-1, 13-2 to 13-n, and timing signals φ1,φ2, φ3, and φ4 are respectively supplied thereto.

A drain of each of P channel transistors Q10 is connected to the other end of each of the bit line BL1, BL2 to BLn. Each transistor Q10 charges the bit line BL1 to BLn. A power supply voltage $V_{BL}$ is supplied to each source, and a timing signal φ5 is supplied to each gate. The power supply voltage $V_{BL}$ is set to be 9 V at the time of the writing operation, and 5 V at the time of the other operations. The timing signals φ1 to φ5 are generated by a clock generator 17-1 included in the controlling circuit 17. In FIG. 3, the word line and the select line are omitted.

FIG. 1 shows the main part of the present invention and is the sense/latch circuit. In FIG. 1, the structure of only the sense/latch circuit 13-1 will be explained since all sense/latch circuits have the same structure.

One end of each of the current paths of N channel transistors Q7 and Q8 is respectively connected to the data lines D and /D. Each of inverters IN1 and IN2 constituting the latch circuit LT is connected to the other end of each of the current paths of N channel transistors Q7 and Q8. In other words, the input end of the inverter circuit IN1 and the output end of the inverter circuit IN2 are connected to the other end (node A) of the current path of the transistor Q7. The output end of the inverter circuit IN1 and the input end of the inverter circuit IN2 are connected to the other end (node B) of the current path of the transistor Q8. One end of a current path of an N channel transistor Q1 is connected to the node A, and one end of a current path of an N channel transistor Q2 is connected to the node B. The timing signals φ1 and φ2 are supplied to these transistors Q1 and Q2, respectively. The other end of the current path of each of the transistors Q1 and Q2 is connected to one end of a current path of an N channel transistor Q3. The other end of the current path of the transistor Q3 is grounded, and the gate is connected to the bit line BL1.

Moreover, one end of a current path of an N channel transistor Q4 is connected to the node A. The timing signal φ4 is supplied to the gate of the transistor Q4, and the other end of the current path is connected to the bit line BL1. Moreover, a gate of an N channel transistor Q5 is connected to the node B. One end of a current path of the transistor Q5 is connected to the verify end VF, and the other line is connected to one end of a current path of an N channel transistor Q6. The timing signal φ3 is supplied to a gate of the transistor Q6, and the other end of the current path of the transistor Q6 is grounded. It is noted that the transistor Q6 and the timing signal φ3 can be omitted.

NAND-structured flash memories 21-1 are connected to the bit line BL1. The respective memory cells MC1, MC2 . . . MCn of the flash memory 21-1 are connected to the memory cell connected to the other bit line by the word lines WL1 to WLn. The respective select transistors ST1 an ST2 are connected to the select transistor connected to the other bit line by the select lines SL1 and SL2. The plurality of memory cells, simultaneously selected by one word line, constitutes one page.

The following will explain an operation of the sense/latch circuit 13-1 with reference to FIGS. 4 to 9.

FIG. 4 shows an operation for writing data to the memory cell. In the writing operation, writing data is latched to the latch circuit LT. For writing data to the memory cell, the node A of the latch circuit LT is set to be a low level as shown by a broken line, and the node B is set to be a high level. In other words, the transistors Q7 and Q8 are turned on by a column select signal CS1, the node A of the latch circuit LT is set to be a low level through the data lines D, /D, and the node B of the latch circuit LT is set to be a high level through the data lines D, /D. Thereafter, the transistor Q4 is turned on by the timing signal φ4, and data is written to the selected memory cell through the bit line BL1. The data writing operation to the memory cell is the same as the operation described in the explanation of the prior art. If data is sufficiently written to the memory cell, the threshold voltage of the memory cell is increased, and the memory cell is turned off.

FIG. 5 shows a write verify operation for verifying the data writing state. In this case, the bit line BL1 is precharged by the transistor Q10 shown in FIG. 3. Thereafter, the potential of the word line of the memory cell to be selected is increased to a verify level (0.5 V). In a case where data is written to the selected memory cell and the threshold voltage becomes sufficiently high, the memory cell is turned off, and the charging potential of the bit line BL1 is maintained as shown by a solid line. However, in a case where data is not fully written thereto, the memory cell is turned on, the potential of the bit line BL1 is discharged, and the voltage is decreased as shown by a broken line.

It is assumed that the transistor Q2 is turned on by the timing signal φ2 after the memory cell is selected as mentioned above. In a case where data is not sufficiently written and the potential of the bit line BL1 is low, the transistor Q3 is turned off, the node B of the latch circuit LT is set to be a high level and the node A is set to be a low level as shown by a broken line. In other words, in a case where data is not fully written to the memory cell, the state of the latch circuit LT is unchanged, and maintained to be the same as the state at the time when the writing is started. At this time, the transistor Q5 is turned on. Then, if the transistor Q6 is turned on by the timing signal φ3, the verify line VF is set to be a low level. In the case where the verify line VF is set to be a low level, the above-mentioned writing operation is executed again by use of writing data stored in the latch circuit LT.

On the other hand, in a case where data is sufficiently written to the memory cell and the potential of the bit line BL1 is high, the transistor Q3 is turned on, and the state of the latch circuit LT is changed. In other words, the node B of the latch circuit LT is changed. In other words, the node B of the latch circuit LT is set to be a low level, and the node A is set to be a high level as shown by a broken line, and the transistor Q5 is turned off. Due to this, the verify line VF is set to be a high level, and the writing operation is ended.

FIG. 6 shows a data reading operation. For reading data of the memory cell, the bit line BL1 is first precharged. Thereafter, the transistor Q1 is turned on by the timing signal φ1 and the latch circuit LT is reset. Next, the word line is boosted to select a memory cell. In a case where data is written to the selected memory cell and the threshold voltage is sufficiently high, the charging potential of the bit line BL1 is maintained since the memory cell is turned off. However, in a case where data is not written thereto, the memory cell is turned on, the potential of the bit line BL1 is discharged, and the voltage is decreased.

Under the above state, it is assumed that the transistor Q2 is turned on by the timing signal $\phi 2$. In a case where data is not sufficiently written to the memory cell and the potential of the bit line BL1 is low, the transistor Q3 is turned off, the node B of the latch circuit LT is set to be a high level and the node A is set to be a low level as shown by a broken line. Moreover, in a case where data is written to the memory cell, the node B of the latch circuit LT is reverted to be a low level and the node A is reverted to be a high level as shown by a solid line since the transistor Q3 is turned on. Data read to the latch circuit LT is transmitted to the data lines D, /D through the transistors Q7 and Q8.

Figure 20:
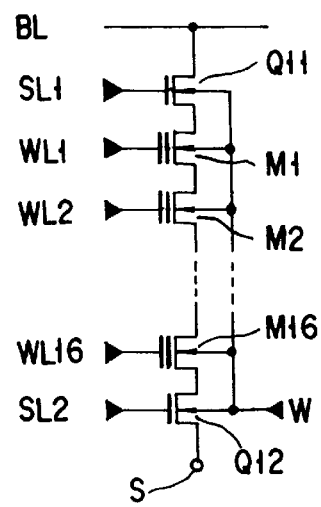
FIG. 20 is a circuit diagram showing a cell structure of a NAND-structured flash memory.
Figure 21A:
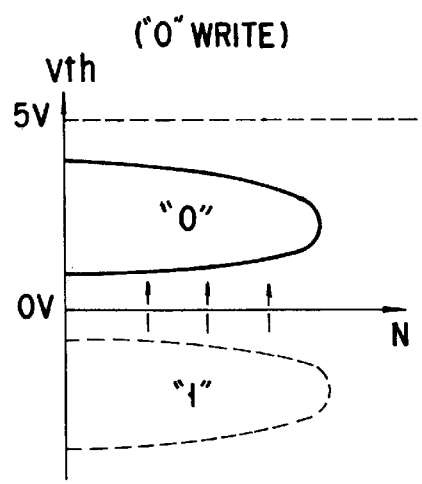
FIG. 21A is a view showing a writing operation of the circuit of FIG. 20.
Figure 21B:
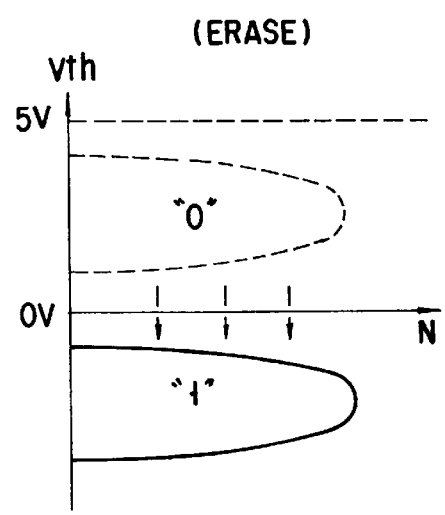
FIG. 21B is a view showing an erasing operation of the circuit of FIG. 20.
Figure 23A:
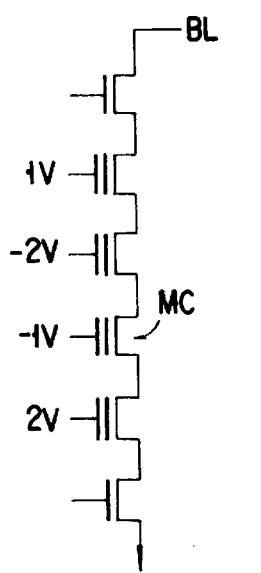
FIGS. 23A to 23C are circuit diagrams showing the operation of FIG. 20.
Figure 23B:
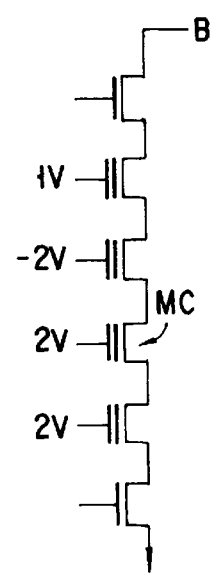
Figure 23C:
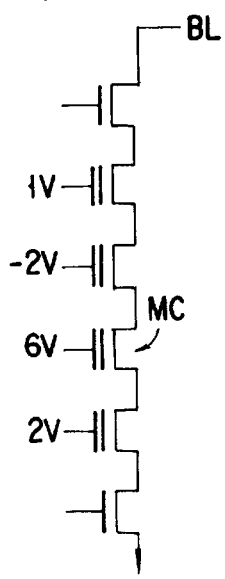

The erasing operation is the same as the case explained by use of FIGS. 20 and 22. More specifically, the bit line BL is opened, 0 V is applied to the select line SL1, 0 V is applied to the word line WL of the memory cell, 0 V is applied to the select line SL2, 18 V is applied to the well W, and 18 V is applied to the common source line S. As a result, a tunnel current is supplied between the floating gate and the well through the gate insulation film, and the threshold voltage becomes 0 V or less.

FIG. 7 shows an erase verifying operation. In this case, the bit line BL1 is precharged. Thereafter, the transistor Q2 is turned on by the timing signal $\phi 2$, so that the latch circuit LT is reset. Next, the word line is boosted to select a memory cell. Then, the transistor Q1 is turned on by the timing signal $\phi 1$ to read the potential of the bit line. As a result, in a case where the erasing is sufficiently made, the potential of the bit line BL1 is decreased, and the node B of the latch circuit LT is set to be a low level as shown by a solid line. In a case where the erasing is not sufficiently made, the potential of the bit line B1 is not decreased, and the node B of the latch circuit LT is set to be a high level as shown by a broken line. Due to this, if the transistor Q6 is turned on by the timing signal $\phi 3$, the potential of the verify line VF is decreased. Even if there is present one memory cell whose erasure is not sufficiently made, the above erasing operation is executed.

FIG. 8 shows an operation of FIG. 1, that is, an embodiment of an operation for saving a memory cell, which is in an overwrite state. According to this embodiment, after the above-mentioned writing operation (ST1), a write verifying operation (ST2) is performed. As a result, if the writing is normally ended, an overwrite verifying operation (ST3) for verifying the memory cell in which the threshold voltage exceeds 5 V is performed. As a result, if there is no memory cell, which is in an overwrite state, a series of writing operations is ended.

On the other hand, if there is a memory cell, which is in an overwrite state, data, which is stored in the memory cell, is copied to the latch circuit LT (ST4). Then, data corresponding to one page including the memory cell, which is in the overwrite state, is erased (ST5). Thereafter, the writing operation and the write verifying operation are performed again (ST1 and ST2), data, which is copied to the latch circuit LT, is written to the memory cell in which data is erased.

Figure 9:
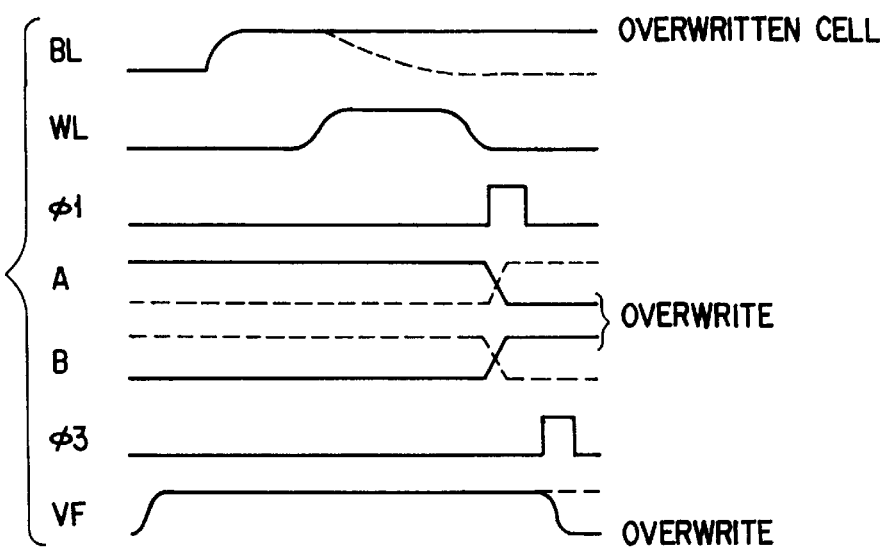
FIG. 9 is a timing view showing an overwrite verifying operation of FIG. 1.

FIG. 9 is the overwrite verifying operation. Similar to the write verifying operation of FIG. 5, in the overwrite verifying operation, the bit line BL1 is precharged. Thereafter, it is assumed that the potential of the word line of a memory cell to be selected is increased to a verify level, which is higher than the case of the normal reading operation. If the selected memory cell is in an overwrite state, the memory cell is turned off. Due to this, the charge potential of bit line BL1 is maintained. However, if data is normally written or data is not written, the memory cell is turned on. Due to this, the electric charge of the bit line BL1 is decreased. Thereafter, the transistor Q1 is turned on by timing signal $\phi 1$. As a result, if data is normally written or data is not written and the potential of the bit line BL1 is low, the transistor Q3 is turned off and the node A of the latch circuit LT is set to be a high level state, and the node B is set to be a low level state. In this case, the transistor Q5 is turned off. If the transistor Q6 is turned on by timing signal $\phi 3$, the verify line VF is set to be a high level state. Therefore, the writing operation is ended.

On the other hand, in a case where the memory cell, which is in an overwrite state, is present, the transistor Q3 is turned on since the potential of the bit line BL1 is set to be a high level state. Due to this, if the transistor Q1 is turned on by timing signal $\phi 1$, the node A of the latch circuit LT is set to be a low level state and the node B is set to be a high level state. In this case, the transistor Q5 is turned on. Due to this, if the transistor Q6 is turned on by timing signal $\phi 3$, the verify line VF is set to be a low level state. As mentioned above, in a case where the verify line VF is set to be the low level, the control section 17 recognizes that the memory cell, which is in an overwrite state, is present, and the copying operation (ST4) of data stored in the memory cell is executed.

Figure 10:
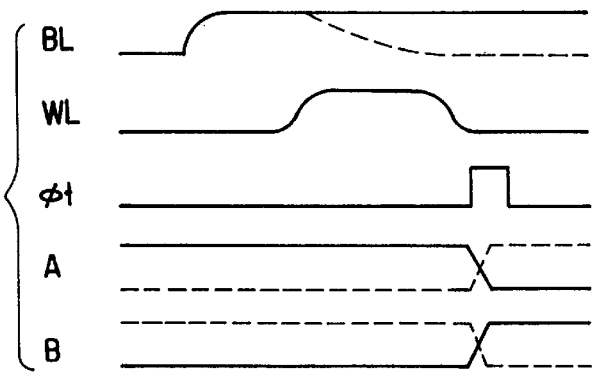
FIG. 10 is a timing view showing a copy operation of cell data of FIG. 1.

FIG. 10 shows the copying operation of data. Similar to the above-mentioned reading operation, in the copying operation, the bit line BL1 is first precharged, and a normal bias is supplied to the memory cell. In other words, the selected word line is set to be a low level (0 V), and the non-selected word line is set to be a high level (5 V). Thereafter, it is assumed that the transistor Q1 is turned on by timing signal $\phi 1$. As a result, if data is not written and the potential of the bit line BL1 is low, the transistor Q3 is turned off, and the node A of the latch circuit LT is set to be in a high level as shown by a broken line, and the node B is set to be a low level.

On the other hand, in a case where data is normally written or the memory cell, which is in an overwrite state, is present, the transistor Q3 is turned on since the potential of the bit line BL1 is set to be a high level state. Due to this, if the transistor Q1 is turned on by timing signal $\phi 1$, the node A of the latch circuit LT is set to be a low level state and the node B is set to be a high level state. In other words, written data is latched to the node A of the latch circuit LT connected to the memory cell where data is to be written, and data is not latched to the latch circuit LT connected to the memory cell where data is not written.

As mentioned above, after data of each memory cell is copied to the latch circuit LT, data corresponding to one page is connected to the selected word line. In other words, only the selected word line is set to be in a low level (0 V), other word lines are set to have the same voltage as the well of the memory cell, and data corresponding to one page is erased. Erasing time is for example, 1 ms. Thereafter, by use of data latched to the latch circuit LT, the above-mentioned write operation and write verifying operation are performed, so that data can be normally written to each memory cell.

According to the above embodiment, if the write is normally ended by the write verifying operation, the memory cell, which is in an overwrite state, is detected by the overwrite verifying operation. As a result, if the memory cell, which is in an overwrite state, is detected, data, which is written to the memory cell, is copied to the latch circuit. Thereafter, data corresponding to one page of the memory cell is erased, and data is written again based on data copied to the latched circuit LT. Therefore, the normal threshold voltage of the memory cell, which is in the overwrite state, can be obtained without setting write data to the latch circuit through the data line.

Also, even if there is a memory cell exceeding a predetermined threshold voltage by one write operation, the memory cell can be surely detected and set to the normal threshold voltage. Therefore, reliability of a nonvolatile semiconductor memory device can be improved.

Moreover, the timing signals $\phi1$, $\phi2$, and $\phi4$ to be supplied to the transistors Q1, Q2, and Q4 are changed, so that one latch circuit can be used as a latch circuit of write data, latching means of read data, data latching means at the time of write verifying, data latching means at the time of overwrite verifying, and copying means of data. Therefore, the structure of the circuit can be simplified.

Furthermore, in the state that the erase verify is ended, if data is not sufficiently written to the memory cell, data, which is latched to the latch circuit LT, is unchanged, that is, data is maintained to be the same as the case of writing. Thereafter, for performing the writing operation, there is an advantage in that data is not needed to be set through the data line.

Also, since there is no through-path of current in the sense/latch circuit, consumption of power can be reduced, and the potential of the bit line is not varied.

Figure 11:
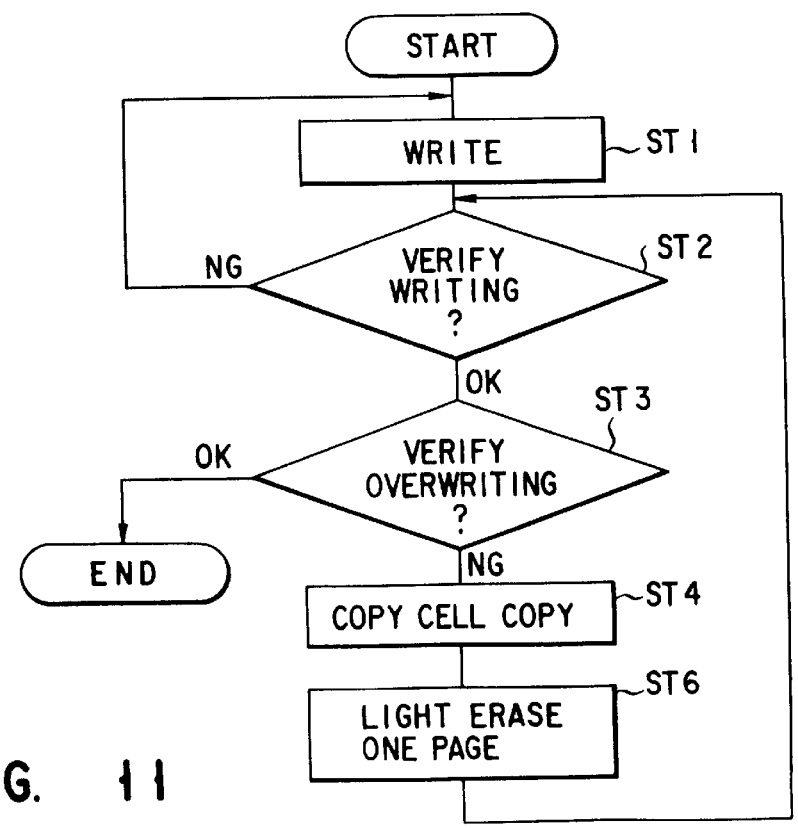
FIG. 11 shows an operation of FIG. 1, and is a flow chart showing another embodiment of saving the overwritten cell.

FIG. 11 shows another embodiment of an operation for saving the memory cell, which is in the overwrite state, and the same reference numerals are added to the portions common to FIG. 8.

In the case of the embodiment of FIG. 8, data of each memory cell is copied to each latch circuit, and data corresponding to one page is completely erased. Thereafter, the writing operation is performed, and data copied to each latch circuit is written to each memory cell. In contrast, according to the embodiment of FIG. 11, data of each memory cell is copied to each latch circuit (ST4), and data corresponding to one page is lightly erased, and the threshold voltage of the overwrite memory cell set to the threshold voltage of the normally written memory cell (ST6). In other words, only the selected word line is set to be in a low level (0 V), other word lines are set to have the same voltage as the well of the memory cell and erasing time is set to be shorter than 1 ms of the aforementioned embodiment. Thereby, data corresponding to one page is lightly erased (ST6). Then, the write verifying operation is performed (ST2). As a result, if there is a memory cell, which is overerased, the writing operation is performed (ST1), and data copied to the latch circuit LT is written to the memory cell.

Also, as a result of the write verifying operation (ST2), if the writing result is good, overwrite verifying operation (ST3), the copying operation of data (ST4), and the light erasing operation (ST6) can be repeatedly performed until a good overwrite verifying result can be obtained.

As mentioned above, the embodiment of FIG. 11 can obtain the same advantage as that of FIG. 8. Also, according to the embodiment of FIG. 11, since erasing time can be reduced, time for saving the memory cell, which is in an overwrite state, can be reduced.

Figure 12:
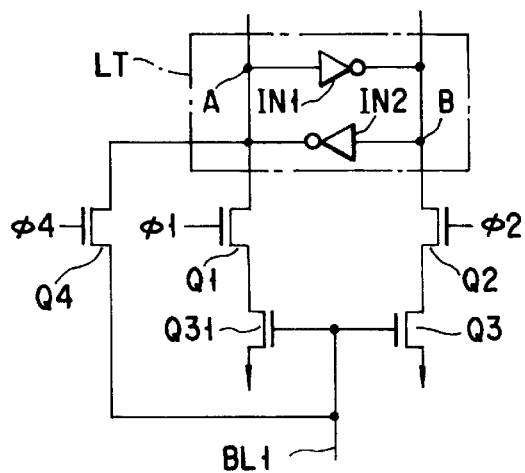
FIG. 12 is a circuit diagram of a main part showing a second embodiment of a sense/latch circuit.
Figure 13:
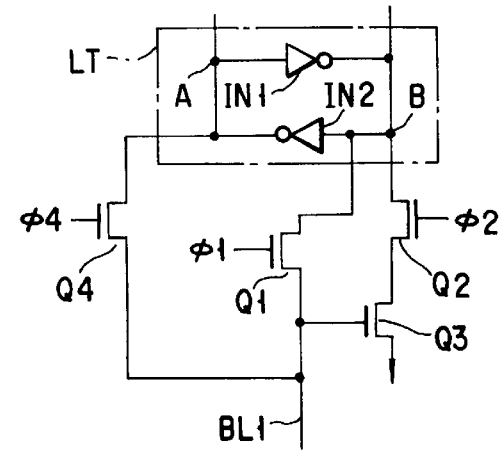
FIG. 13 is a circuit diagram of a main part showing a third embodiment of a sense/latch circuit.

FIGS. 12 and 13 shows other embodiments of the sense/latch circuit. In these figures, the same reference numerals are added to the portions common to the case of FIG. 1. The following will explain only the different portions.

In FIG. 12, the other end of the current path of the transistor Q1 is grounded through a transistor Q31. A gate of the transistor Q31 is connected to the bit line BL1 together with the gate of the transistor Q3. In FIG. 13, one end of the current path of the transistor Q1 is connected to the node B in place of the node A.

The sense/latch circuits of FIGS. 12 and 13 have the following common functions.

(a) Similar to FIG. 1, the transistor Q1 transfers data stored in the node A of the latch circuit LT to the bit line.

(b) In a case where the bit line BL1 is set to be a high level, the node A is set to be a low level. In other words, if the bit line BL1 is in a high level state, the transistors Q3 and Q31 are turned on. Under this state, the transistor Q1 is turned on, the node A is set to be a low level. Also, in FIG. 13, the transistor Q1 is turned on, so that the node A, serving as an output terminal of the inverter IN2 is set to be a low level.

(c) In a case where the bit line BL1 is set to be a high level, the node B is set to be a low level. In other words, if the bit line BL1 is in a high level state, the transistors Q3 and Q31 are turned on. As a result, the transistor Q2 is turned on, so that the node B is set to be a low level.

As mentioned above, the sense/latch circuits of FIGS. 12 and 13 can obtain the same advantage as the case of FIG. 1.

Figure 14:
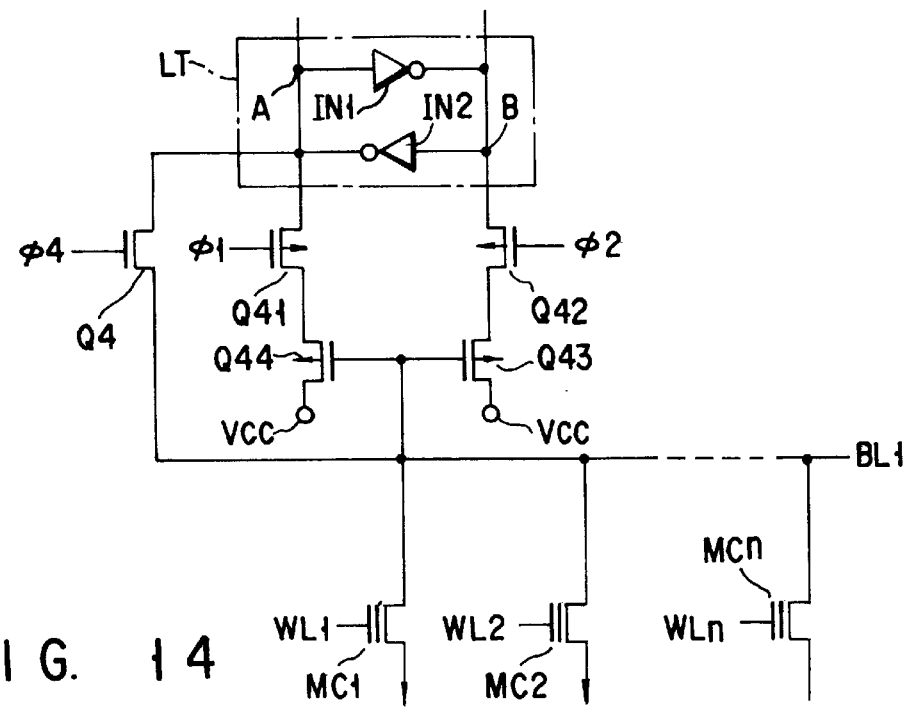
FIG. 14 is a circuit diagram of a main part showing a fourth embodiment of a sense/latch circuit.

FIG. 14 shows another embodiment of the sense/latch circuit.

Figure 19A:
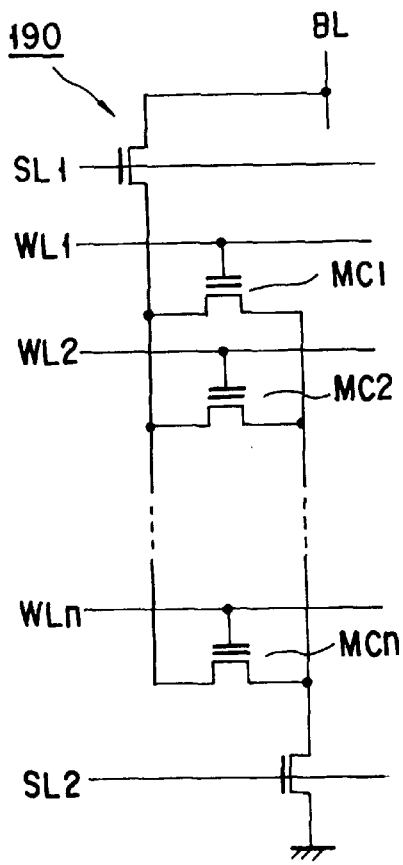
FIG. 19A is a circuit diagram showing a cell structure of an AND-structured flash memory.
Figure 19B:
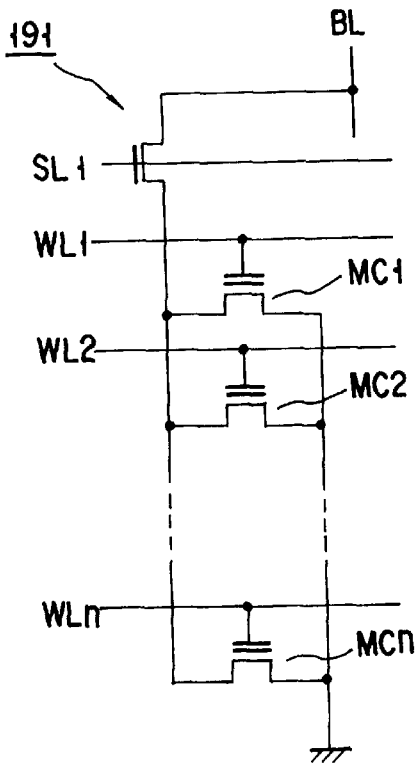
FIG. 19B is a circuit diagram showing a cell structure of a DINOR-structured flash memory.

The sense/latch circuit of FIG. 14 is applied to a type of memory in which a plurality of memory cells are connected to the bit line in parallel. In such a memory, since the memory cells are connected to the bit line in parallel, it is difficult to read the other memory cell if the threshold voltage of the memory cell is lower than the voltage of the non-selected word line, for example, 0 V. FIG. 14 shows a case in which such a circuit is applied to a NOR flash memory. If the condition is satisfied, the circuit can be applied to an AND-structured flash memory 190 of FIG. 19A, and a DINOR (Divided NOR)-structured flash memory 191 of FIG. 19B.

The circuit of FIG. 14 comprises P channel transistors Q41 to Q44 in place of the N channel transistors Q1 to Q3 and Q31 of the circuit shown in FIG. 12. Gates of the transistors 43 and 44 are connected to the bit line BL1. A drain of each of the memory cells MC1, MC2 to MCn is connected to the bit line BL1, and a source of each of the memory cells MC1, MC2 to MCn is connected each other. Power source Vcc is connected to each source of the transistors Q43 and Q44, and each drain is connected to each source of the transistors Q42 and Q41. Each drain of the transistors Q41 and Q42 is connected to each of nodes A and B. Then, timing signals $\phi1$ and $\phi2$ are supplied to the gates of the transistors Q41 and Q42, respectively. It is noted that the transistor Q44 can be omitted, and that the source of the transistor Q41 can be connected to the drain of the transistor Q43.

The following will explain an operation in the above-mentioned structure.

Figure 15:
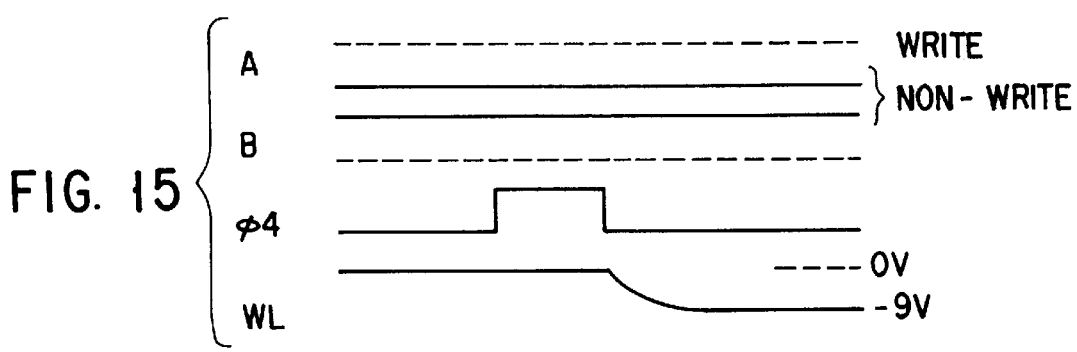
FIG. 15 is a timing view showing a writing operation of FIG. 14.

FIG. 15 shows an operation for writing data to the memory cell. The writing operation first latches writing data to the latch circuit LT. In a case where data is written to the memory cell, the node A of the latch circuit LT is set to be a high level as shown by a broken line, and the node B is set to be a low level as shown by a broken line. In the latch circuit connected to the non-writing bit line, as shown by a solid line, the node A is set to be a low level, and the node B is set to be a high level. Thereafter, the transistor Q4 is turned on by the timing signal φ4, and data is written to the selected memory cell through the bit line BL1. At this time, the word line of the memory cell to be selected is set to be −9 V, and the voltage of the word line of the non-selected memory cell is set to be 0 V. If data is sufficiently written to the memory cell, the threshold voltage of the memory cell is decreased.

Figure 16:
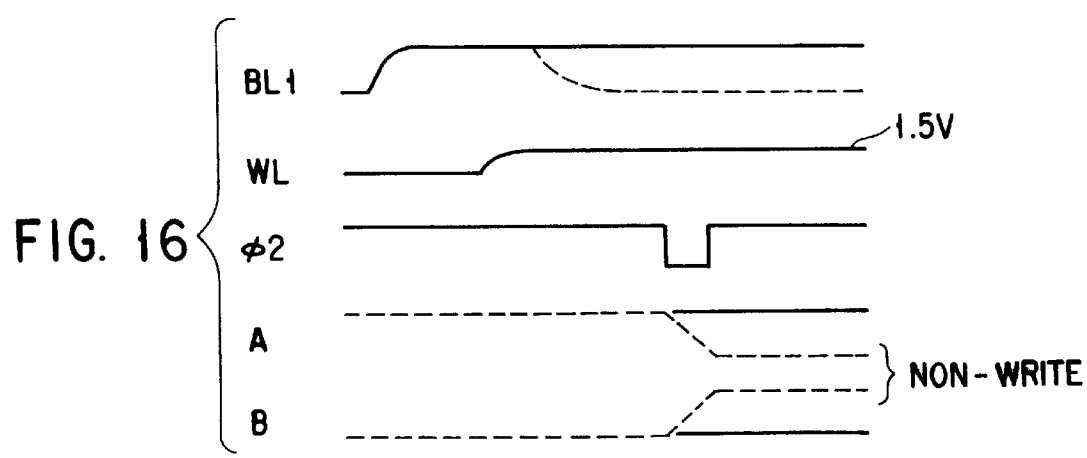
FIG. 16 is a timing view showing a write verifying operation of FIG. 14.

FIG. 16 shows a write verifying operation for verifying data writing state. In this case, the bit line BL1 is precharged, and the voltage of the word line of the memory cell to be selected is increased to be a verify level, for example, 1.5 V. The potential of the word line of the non-selected memory cell is 0 V. If data is written to the selected memory cell and the threshold voltage is low, the memory cell is turned on, so that the bit line BL1 is discharged as shown by a broken line. However, if data is not sufficiently written, the memory cell is turned off. Due to this, the charge of the bit line BL1 is not charged, and the potential is maintained as shown in a solid line.

Thereafter, it is assumed that the transistor Q42 is turned on by timing signal φ2. Then, if data is sufficiently written, and the potential of the bit line BL1 is lower, the nodes A and B of the latch circuit LT are inverted. In other words, since the transistor Q43 is turned on in accordance with the potential of the bit line BL1, the node B of the latch circuit LT is set to be a high level as shown by a broken line, and the node A is set to be a low level. Due to this, the verify line VF is set to be a low level, and the writing operation is ended. Also, if data is not sufficiently written to the memory cell, the state of the latch circuit LT is maintained as the case at the time of writing, that is, the state is unchanged. In this case, the verify line VF is set to be a high level, and the above-mentioned writing operation is executed again by use of writing data stored in the latch circuit LT.

Figure 17:
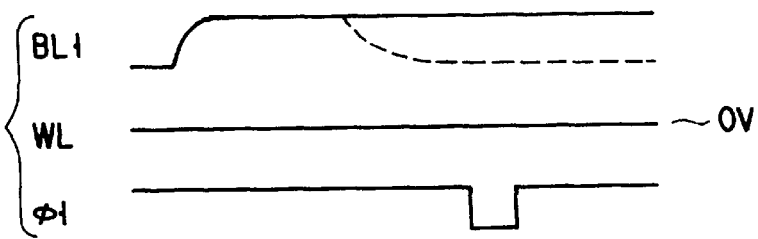
FIG. 17 is a timing view showing an overwrite verifying operation of FIG. 14.

FIG. 17 shows an overwrite verifying operation. In the overwrite verifying operation, the potentials of all word lines are set to be a non-selection level of 0 V, or a verifying level of 0.5 V, and the bit line BL1 is precharged. If the memory cell is in an overwrite state, the memory cell is turned on. Due to this, the bit line BL1 is discharged, and the potential is set to be a low level. Thereafter, the transistor Q41 is turned on by timing signal φ1. If there is a memory cell, which is in an overwrite state, the potential of the bit line BL1 is set to be a low level. Due to this, the transistor Q44 is turned on. Then, the node A of the latch circuit LT is set to be a high level, and the node B is set to be a low level. In this case, since the transistor Q5 shown in FIG. 1 is turned off, the verify line VF is set to be a high level when the transistor Q6 is turned on by the timing signal φ3, the verify line VF is set to be a high level. As mentioned above, if the verify line VF is set to be a high level, the controlling section 17 recognizes that the memory cell is in an overwrite state, and a copy operation of data stored in the memory cell is executed.

Figure 18:
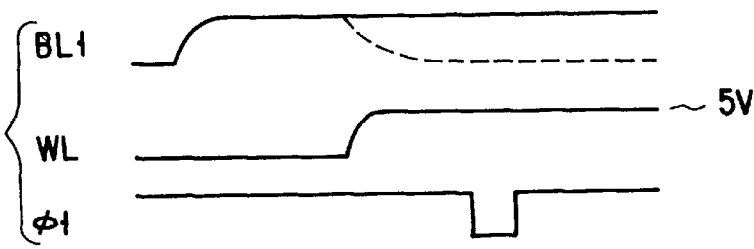
FIG. 18 is a timing view showing a copy operation of cell data of FIG. 14.

FIG. 18 is a copy operation of data. In the copy operation, the bit line BL1 is first precharged, and the word line WL serves as a normal reading potential. Thereafter, the transistor Q41 is turned on by timing signal φ1. In a case where the memory cell is in a writing state, since the potential of the bit line BL1 is set to be a low level, the transistor Q44 is turned on, the node A of the latch circuit LT is set to be a high level, and the node B is set to be a low level. Moreover, in a case where the memory cell is in a non-writing state, since the potential of the bit line BL1 is set to be a high level, the transistor Q44 is turned off, the node A of the latch circuit LT is set to be a low level, and the node B is set to be a high level. As mentioned above, after data of the memory cell is copied to the latch circuit LT, data of the memory cell is erased. Then, data copied to the latch circuit LT is written to the erased memory cell again.

The above embodiment can also obtain the same advantage as the embodiments shown in FIGS. 1, 12, and 13.

What is claimed is:

1. A nonvolatile semiconductor memory device comprising:

a memory cell array comprising a plurality of memory cells, wherein terminals of said memory cells are connected in series;

a bit line connected to one end of said memory cell array;

a latch circuit, having first and second nodes, for storing writing data;

a first transistor having a first terminal connected to ground and a second terminal wherein a conductive state of said first transistor is controlled in accordance with a potential of said bit line;

a second transistor having a first terminal connected to said second node of said latch circuit and a second terminal connected to said second terminal of said first transistor, wherein a conductive state of said second transistor is controlled by a first timing signal;

a third transistor having a first terminal connected to said first node of said latch circuit and a second terminal connected to said second terminal of said first transistor, wherein a conductive state of said third transistor is controlled by a second timing signal; and a verify circuit for verifying completion of a write operation, said verify circuit connected between one of said first and second nodes of said latch circuit and a verify line, wherein said verify circuit outputs a signal to said verify line in accordance with a latched state of said latch circuit.

2. A device according to claim 1, wherein said first node of said latch circuit is set to be a high level and said second node of said latch circuit is set to be a low level after the writing data has been written to a selected memory cell of said memory cell array.

3. A device according to claim 2, wherein said verify circuit comprises a fourth transistor having a first terminal connected to said verify line and a gate connected to said one of said first and second nodes of said latch circuit.

4. A device according to claim 3, wherein said verify circuit comprises a fifth transistor having a first terminal connected to a second terminal of said fourth transistor and a second terminal connected to ground, said fifth transistor being set conductive in accordance with a third timing signal supplied to a gate of said fifth transistor.

5. A device according to claim 3, wherein said fourth transistor is set conductive when said first node of said latch circuit is set to be a low level and said second node of said latch circuit is set to be a high level.

6. A device according to claim 3, wherein said latch circuit comprises a flip-flop circuit including first and second inverter circuits, an input terminal of said first inverter being connected to an output terminal of said second inverter and an output terminal of said first inverter being connected to an input terminal of said second inverter.

7. A nonvolatile semiconductor memory device comprising:

a memory cell array comprising a plurality of memory cells, wherein terminals of said memory cells are connected in series;

a bit line connected to one end of said memory cell array;

a latch circuit, having first and second nodes, for storing writing data;

a first transistor having a first terminal connected to said bit line and a second terminal connected to said first node of said latch circuit, wherein said first transistor supplies the writing data stored in said latch circuit to a selected memory cell of said memory cell array in accordance with a first timing signal supplied to a gate of said first transistor;

a second transistor having a first terminal connected to ground and a second terminal wherein a conductive state of said second transistor is controlled in accordance with a potential of said bit line;

a third transistor having a first terminal connected to said second node of said latch circuit and a second terminal connected to said second terminal of said second transistor, wherein a conductive state of said third transistor is controlled by a second timing signal;

a fourth transistor having a first terminal connected to said first node of said latch circuit and a second terminal connected to said second terminal of said second transistor, wherein a conductive state of said fourth transistor is controlled by a third timing signal; and a verify circuit for verifying completion of a write operation, said verify circuit connected between one of said first and second nodes of said latch circuit and a verify line, wherein said verify circuit outputs a signal to said verify line in accordance with a latched state of said latch circuit.

8. A device according to claim 7, wherein said latch circuit comprises a flip-flop circuit including first and second inverter circuits, an input terminal of said first inverter being connected to an output terminal of said second inverter and an output terminal of said first inverter being connected to an input terminal of said second inverter.

9. A nonvolatile semiconductor memory device comprising:

a memory cell array comprising a plurality of series circuits, each of said series circuits including memory cells connected in series;

a plurality of bit lines, each of said bit lines connected to one end of each of said series circuits;

a plurality of latch circuits, each of said latch circuits having first and second nodes, for storing writing data;

a plurality of first transistors, each of said first transistors having a first terminal connected to ground and a second terminal, wherein a conductive state of each of said first transistors is controlled in accordance with a potential of each of said bit lines respectively;

a plurality of second transistors, each of said second transistors having a first terminal connected to said second node of a corresponding one of said latch circuits and a second terminal connected to said second terminal of a corresponding one of said first transistors, wherein a conductive state of each of said second transistors is controlled by a first timing signal;

a plurality of third transistors, each of said third transistors having a first terminal connected to said first node of a corresponding one of said latch circuits and a second terminal connected to said second terminal of a corresponding one of said first transistors, wherein a conductive state of each of said third transistors is controlled by a second timing signal; and a verify line for transmitting a signal from said latch circuits, said signal representing whether the writing data is fully written to corresponding memory cells of said memory cell array.

10. A device according to claim 9, wherein said verify line transmits a low level signal when the writing data is not fully written to said memory cells and transmits a high level signal when the writing data is fully written to said memory cells.

11. A device according to claim 9, further comprising fourth and fifth transistors connected in series between said verify line and ground, at least one of said fourth transistors being set conductive when the writing data is not fully written and said fifth transistors being set conductive in accordance with a third timing signal supplied to gates of said fifth transistors.

12. A device according to claim 11, wherein said verify line is disposed commonly for a plurality of said latch circuits.

13. A nonvolatile semiconductor memory device comprising:

a memory cell array comprising a plurality of series circuits, each of said series circuits including memory cells connected in series;

a plurality of bit lines, each of said bit lines connected to one end of each of said series circuits;

a plurality of sense/latch circuits connected to each of said bit lines; and a verify line connected to each of said sense/latch circuits, wherein each of said sense/latch circuits comprises:

a latch circuit, having first and second nodes, for storing writing data;

a first transistor having a first terminal connected to ground and a second terminal wherein a conductive state of said first transistor is controlled in accordance with a potential of each of said bit lines;

a second transistor having a first terminal connected to said second node of said latch circuit and a second terminal connected to said second terminal of said first transistor, wherein a conductive state of said second transistor is controlled by a first timing signal;

a third transistor having a first terminal connected to said first node of said latch circuit and a second terminal connected to said second terminal of said first transistor, wherein a conductive state of said third transistor is controlled by a second timing signal; and a verify circuit for verifying completion of a write operation, said verify circuit connected between one of said first and second nodes of said latch circuit and said verify line, wherein said verify circuit outputs a signal to said verify line in accordance with a latched state of said latch circuit.

14. A device according to claim 13, wherein said latch circuit comprises a flip-flop circuit including first and second inverter circuits, an input terminal of said first inverter being connected to an output terminal of said second inverter and an output terminal of said first inverter being connected to an input terminal of said second inverter.

15. A device according to claim 13, wherein said verify line transmits a low level signal when the writing data is not fully written to said memory cells and said verify line transmits a high level signal when the writing data is fully written to said memory cells.

16. A device according to claim 13, wherein said verify circuit comprises fourth and fifth transistors connected in series between said verify line and ground, said fourth transistor being set conductive when the writing data is not fully written and said fifth transistor being set conductive in accordance with a third timing signal supplied to a gate of said fifth transistor.

17. A nonvolatile semiconductor memory device comprising:

a memory cell array comprising a plurality of memory cells, wherein terminals of said memory cells are connected in series;

a bit line connected to one end of said memory cell array;

a flip-flop circuit for storing writing data, said flip-flop circuit including first and second inverter circuits, an input terminal of said first inverter being connected to an output terminal of said second inverter and an output terminal of said first inverter being connected to an input terminal of said second inverter;

a first transistor having a first terminal connected to ground and a second terminal wherein a conductive state of said first transistor is controlled in accordance with a potential of said bit line;

second and third transistors having first terminals commonly connected to said second terminal of said first transistor, a second terminal of said second transistor connected to said output terminal of said first inverter circuit and a second terminal of said third transistor connected to said output terminal of said second inverter circuit, wherein a conductive state of said second and third transistors is controlled by first and second timing signals respectively; and a verify circuit for verifying completion of a write operation, said verify circuit connected between said output terminal of said first inverter circuit and a verify line, wherein said verify circuit outputs a signal to said verify line in accordance with writing data stored in said flip-flop circuit.

18. A device according to claim 17, wherein said verify circuit comprises a fourth transistor having a first terminal connected to said verify line and a gate connected to said output terminal of said first inverter circuit.

19. A device according to claim 18, wherein said verify circuit comprises a fifth transistor having a first terminal connected to a second terminal of said fourth transistor and a second terminal connected to ground, said fifth transistor being set conductive in accordance with a third timing signal supplied to a gate of said fifth transistor.

20. A device according to claim 19, further comprising a sixth transistor having a first terminal connected to said bit line and a second terminal connected to said flip-flop circuit, wherein said sixth transistor supplies the writing data stored in said flip-flop circuit to a selected memory cell of said memory cell array in accordance with a fourth timing signal supplied to a gate of said sixth transistor.

* * * * *